US009837550B2

(12) United States Patent
Kim et al.

(10) Patent No.: US 9,837,550 B2
(45) Date of Patent: Dec. 5, 2017

(54) THIN FILM TRANSISTOR SUBSTRATE AND METHOD OF FABRICATING THE SAME

(71) Applicant: SAMSUNG DISPLAY CO., LTD., Yongin-si, Gyeonggi-Do (KR)

(72) Inventors: Bong-Kyun Kim, Yongin (KR); Seung-Ho Yoon, Yongin (KR); Shin-Il Choi, Yongin (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 0 days.

(21) Appl. No.: 15/335,897

(22) Filed: Oct. 27, 2016

(65) Prior Publication Data

US 2017/0047434 A1 Feb. 16, 2017

Related U.S. Application Data

(62) Division of application No. 14/717,734, filed on May 20, 2015, now Pat. No. 9,502,579.

(30) Foreign Application Priority Data

Jul. 25, 2014 (KR) ........................ 10-2014-0094802

(51) Int. Cl.
*H01L 29/12* (2006.01)
*H01L 29/786* (2006.01)
(Continued)

(52) U.S. Cl.
CPC ........ *H01L 29/7869* (2013.01); *H01L 21/441* (2013.01); *H01L 21/465* (2013.01);
(Continued)

(58) Field of Classification Search
CPC .............. H01L 29/12; H01L 29/66969; H01L 29/78696; H01L 27/3248; H01L 27/3258
See application file for complete search history.

(56) References Cited

U.S. PATENT DOCUMENTS 6,255,706 B1 * 7/2001 Watanabe ............. H01L 29/458
257/350
2004/0051180 A1 3/2004 Kado et al.
(Continued)

FOREIGN PATENT DOCUMENTS

KR 10-2004-0025598 3/2004
KR 10-2008-0008562 1/2008
(Continued)

OTHER PUBLICATIONS

CN Office Action dated Mar. 1, 2017.

*Primary Examiner* — Phuc Dang
(74) *Attorney, Agent, or Firm* — F. Chau & Associates, LLC

(57) ABSTRACT

A thin film transistor substrate includes a gate electrode disposed on a substrate; a semiconductor layer disposed on the substrate that partially overlaps the gate electrode and includes an oxide semiconductor material; and a source electrode and a drain electrode disposed on the semiconductor layer, where the drain electrode is spaced apart from the source electrode. The source electrode and the drain electrode each include a barrier layer and a main wiring layer, the a main wiring layer is disposed on the barrier layer, and the barrier layer includes a first metal layer disposed on the semiconductor layer, and a second metal layer disposed on the first metal layer.

12 Claims, 4 Drawing Sheets

(51) Int. Cl.
  *H01L 29/417*  (2006.01)
  *H01L 27/12*  (2006.01)
  *H01L 29/66*  (2006.01)
  *H01L 23/532*  (2006.01)
  *H01L 21/465*  (2006.01)
  *H01L 21/4763*  (2006.01)
  *H01L 21/441*  (2006.01)
  *H01L 29/45*  (2006.01)

(52) U.S. Cl.
  CPC .. *H01L 21/47635* (2013.01); *H01L 23/53228* (2013.01); *H01L 23/53238* (2013.01); *H01L 27/124* (2013.01); *H01L 27/1259* (2013.01); *H01L 29/41733* (2013.01); *H01L 29/45* (2013.01); *H01L 29/66969* (2013.01); *H01L 2924/0002* (2013.01)

(56) References Cited

U.S. PATENT DOCUMENTS

| | | |
|---|---|---|
| 2008/0096015 A1 | 4/2008 | Yan |
| 2009/0108256 A1 | 4/2009 | Kwak et al. |
| 2009/0162982 A1 | 6/2009 | Lee et al. |
| 2009/0267087 A1 | 10/2009 | Yang et al. |
| 2010/0032680 A1* | 2/2010 | Kaitoh ............ G02F 1/1368 257/72 |
| 2010/0065841 A1 | 3/2010 | Lee et al. |
| 2010/0270552 A1 | 10/2010 | Song et al. |
| 2012/0286272 A1 | 11/2012 | Ning et al. |
| 2013/0221360 A1 | 8/2013 | Tsang |
| 2013/0299817 A1* | 11/2013 | Park ................ H01L 29/45 257/43 |
| 2014/0131758 A1* | 5/2014 | Shinohara ......... H01L 33/382 257/99 |
| 2014/0239296 A1 | 8/2014 | Tokunaga et al. |
| 2014/0339537 A1 | 11/2014 | Bae |
| 2014/0353658 A1 | 12/2014 | Kishimoto et al. |
| 2015/0221772 A1 | 8/2015 | Fujdala et al. |
| 2015/0318400 A1 | 11/2015 | Morita et al. |
| 2016/0027920 A1 | 1/2016 | Kim et al. |

FOREIGN PATENT DOCUMENTS

| | | |
|---|---|---|
| KR | 10-2009-0044119 | 5/2009 |
| KR | 10-2010-0117937 | 11/2015 |

* cited by examiner

THIN FILM TRANSISTOR SUBSTRATE AND METHOD OF FABRICATING THE SAME

CROSS-REFERENCE TO RELATED APPLICATIONS

This application is a divisional of U.S. patent application Ser. No. 14/717,734, filed on May 20, 2015 in the U.S. Patent and Trademark Office, now U.S. Pat. No. 9,502,579, which in turn claims priority from and the benefit of Korean Patent Application No. 10-2014-0094802, filed on Jul. 25, 2014, in the Korean Intellectual Property Office, the contents of both of which are herein incorporated by reference in their entireties.

BACKGROUND

1. Technical Field

Embodiments of the present disclosure are directed to a thin film transistor substrate, and a method of fabricating the same, and more particularly, to a thin film transistor substrate having improved reliability, and a method of fabricating the same.

2. Discussion of the Related Art

An active-matrix display device uses a thin film transistor as a switching device or a driving device, and includes gate lines for transmitting a scan signal for controlling the thin film transistor, and data lines for transmitting a signal to a pixel electrode.

Recently, to implement high-speed driving in a display device with an increased area, an oxide semiconductor thin film transistor has been developed. In an oxide semiconductor thin film transistor, a semiconductor layer is formed from an oxide semiconductor material, and a signal line is formed from a low-resistance copper or copper alloy. However, an oxide semiconductor layer may be damaged in a process of patterning the signal line by wet etching. The damage to the semiconductor layer may negatively influence reliability of the thin film transistor.

SUMMARY

Embodiments of the present disclosure may provide a thin film transistor substrate having improved reliability.

Further, embodiments of the present disclosure may provide a method of fabricating the thin film transistor substrate.

An exemplary embodiment of the present disclosure provides a thin film transistor substrate the includes a gate electrode disposed on a substrate; a semiconductor layer disposed on the substrate that partially overlaps the gate electrode and includes an oxide semiconductor; and a source electrode and a drain electrode disposed on the semiconductor layer, where the drain electrode is spaced apart from the source electrode. The source electrode and the drain electrode may each include a barrier layer and a main wiring layer, the a main wiring layer is disposed on the barrier layer, and the barrier layer may include a first metal layer disposed on the semiconductor layer and a second metal layer disposed on the first metal layer.

The first metal layer may include at least one of molybdenum (Mo), a molybdenum alloy (Mo alloy), aluminum (Al), an aluminum alloy (Al alloy), germanium (Ge), or niobium (Nb).

The second metal layer may include at least one of titanium (Ti), a titanium alloy (Ti-alloy), molybdenum (Mo), a molybdenum alloy (Mo alloy), aluminum (Al), an aluminum alloy (Al alloy), germanium (Ge), or niobium (Nb).

The main wiring layer may include one of copper or a copper alloy.

The thin film transistor substrate may further comprise a capping layer disposed on the main wiring layer that includes a transparent conductive oxide.

The capping layer may include one of indium-zinc oxide (IZO), gallium-zinc oxide (GZO), or aluminum-zinc oxide (AZO).

A content of a zinc oxide (ZnO) in the transparent conductive oxide may be 70 wt % or more.

The oxide semiconductor material may include at least one of zinc (Zn), indium (In), gallium (Ga), tin (Sn), or a mixture thereof.

Another exemplary embodiment of the present disclosure provides a method of fabricating a thin film transistor substrate that includes forming a gate electrode on a substrate; forming a semiconductor layer that partially overlaps the gate electrode, where the semiconductor layer includes an oxide semiconductor; forming a conductive layer that includes a barrier layer and a main wiring layer on the semiconductor layer; forming a conductive pattern that partially overlaps the gate electrode by etching the semiconductor layer and the conductive layer in a first etching process; etching the main wiring layer in a second etching process wherein a region of the barrier layer that overlaps the gate electrode is exposed; and etching the exposed region of the barrier layer in a third etching process wherein a region of the semiconductor layer that overlaps the gate electrode is exposed. The barrier layer may include a first metal layer disposed on the semiconductor layer and a second metal layer disposed on the first metal layer.

The third etching process may be a dry etching process.

The first etching process and the second etching process may be wet etching processes.

The method may further include forming a capping layer that includes a transparent conductive oxide on the main wiring layer before the first etching process.

Another exemplary embodiment of the present disclosure provides a method of fabricating a thin film transistor substrate that includes forming a gate electrode on a substrate, forming a semiconductor layer that partially overlaps the gate electrode, where the semiconductor layer includes an oxide semiconductor material, forming a barrier layer by depositing a first metal layer on the semiconductor layer, and depositing a second metal layer on the first metal layer, where the first metal layer includes a material that does not form a metal oxide when reacting with the semiconductor when being deposited, forming a main wiring layer MSL on the second metal layer, where the main wiring layer includes a low resistance material; and forming a capping layer on the main wiring layer, where the second metal layer includes a material suitable for dry etching and capable of preventing copper in the main wiring layer from diffusing.

The method may further include etching the semiconductor layer and the conductive layer in a first etching process to form a conductive pattern that partially overlaps the gate electrode, where the first etching process is a wet etching process, etching the main wiring layer in a second etching process wherein a region of the barrier layer that overlaps the gate electrode is exposed, where the second etching process is a wet etching process, and etching the exposed region of the barrier layer in a third etching process wherein a region of the semiconductor layer that overlaps the gate electrode is exposed, where the third etching process is a dry etching process.

DETAILED DESCRIPTION OF EXEMPLARY EMBODIMENTS

Figure 1:
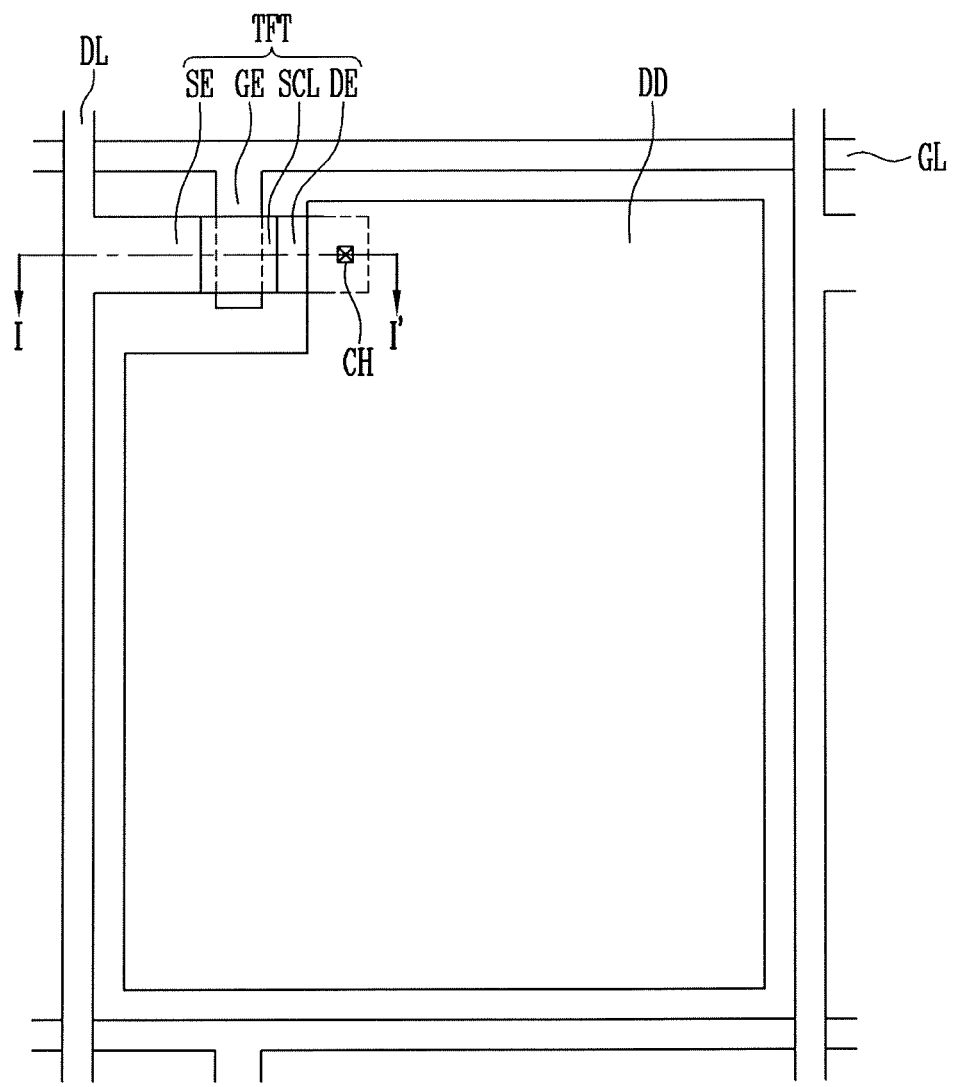
FIG. 1 is a top plan view of a display device that includes a thin film transistor substrate according to an exemplary embodiment of the present disclosure.

Exemplary embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference may numerals refer to like elements throughout.

Embodiments of the present disclosure may be variously modified and have various forms, so that specific embodiments will be illustrated in the drawings and described in the detailed description. However it should be understood that embodiments of the disclosure are not limited to the specific embodiments, but include all changes, equivalents, or alternatives which are included in the spirit and technical scope of the present disclosure.

It will be understood that when an element such as a layer, film, region, or substrate is referred to as being "on" another element, it can be directly on the other element or intervening elements may also be present. Hereinafter, an exemplary embodiment of the present disclosure will be described in detail with reference to the accompanying drawings.

Figure 2:
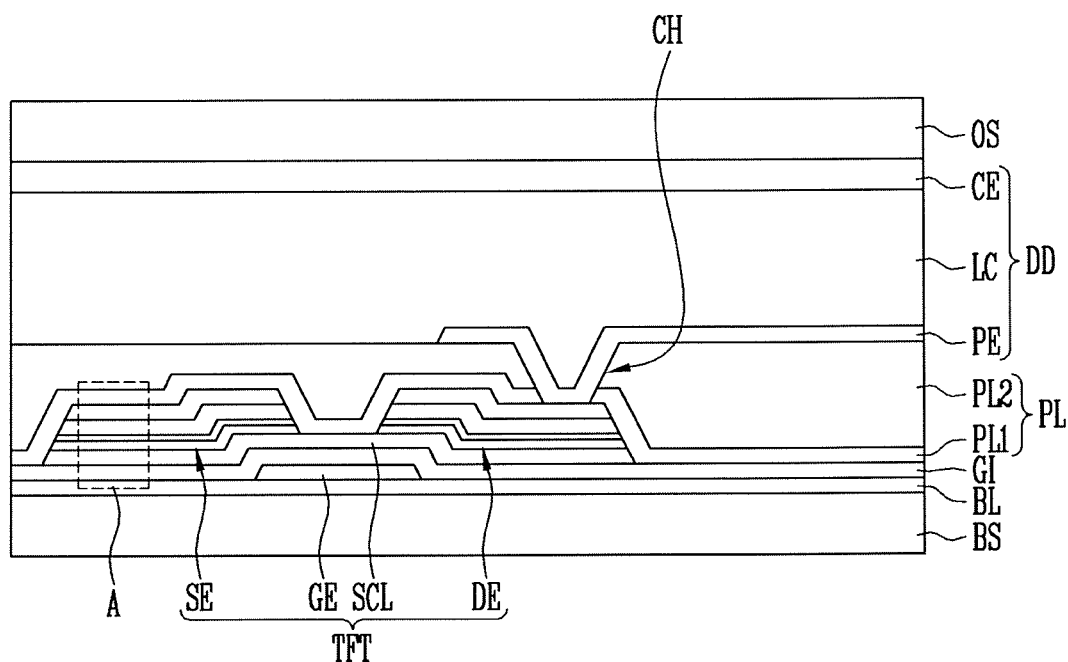
FIG. 2 is a cross-sectional view taken along line I-I' of FIG. 1.
Figure 3:
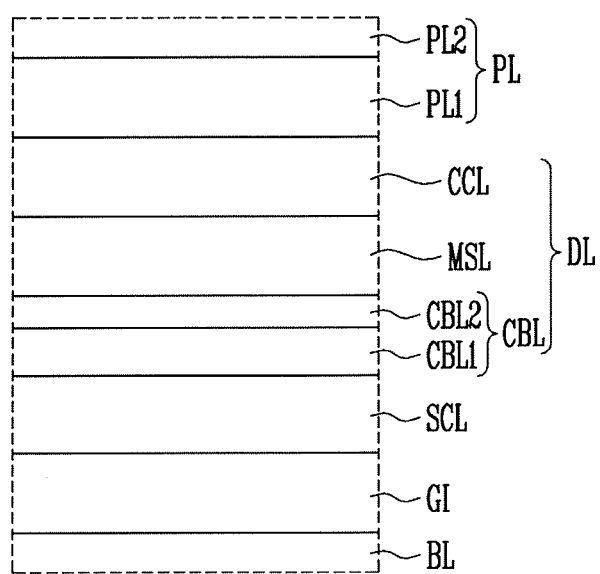
FIG. 3 is an enlarged view of region A of FIG. 2.

FIG. 1 is a top plan view of a display device that includes a thin film transistor substrate according to an exemplary embodiment of the present disclosure, FIG. 2 is a cross-sectional view taken along line I-I' of FIG. 1, and FIG. 3 is an enlarged view of region A of FIG. 2.

Referring to FIGS. 1 to 3, a display device may include a thin film transistor substrate, an opposite substrate OS opposite to the thin film transistor substrate, and a display device DD disposed between the thin film transistor substrate and the opposite substrate OS.

The thin film transistor substrate includes a base substrate BS, and a thin film transistor TFT disposed on the base substrate BS. Here, the thin film transistor TFT may be in contact with a gate line GL and a data line DL which are disposed on the base substrate BS and cross each other.

The base substrate BS includes a transparent insulating material to allow light to pass through. Further, the base substrate BS may be a rigid substrate, or a flexible substrate. A rigid substrate may include a glass substrate, a quartz substrate, a glass ceramic substrate, or a crystalline glass substrate. A flexible substrate may include a film substrate that includes a polymer organic material or a plastic substrate. The material included in the base substrate BS may be resistant to a high processing temperature in a fabricating process.

An insulating layer BL may be disposed between the base substrate BS and the thin film transistor TFT. The insulating layer BL may include at least one of a silicon oxide layer or a silicon nitride layer. The insulating layer BL can prevent impurities from diffusing into the thin film transistor TFT, and can prevent moisture and oxygen from permeating. Further, the insulating layer BL may planarize a surface of the base substrate BS. Alternatively, the insulating layer BL may be omitted.

The thin film transistor TFT may include a gate electrode GE, a semiconductor layer SCL that partially overlaps the gate electrode GE, a source electrode SE connected to one end of the semiconductor layer SCL, and a drain electrode DE connected to the other end of the semiconductor layer SCL.

The gate electrode GE may be disposed on the insulating layer BL, and may overlap the semiconductor layer SCL. Further, the gate electrode GE may protrude from the gate line GL. In addition, the gate electrode GE may include at least one of aluminum AL, an aluminum alloy (Al-alloy), silver (Ag), tungsten (W), copper (Cu), nickel (Ni), chrome (Cr), molybdenum (Mo), titanium (Ti), platinum (Pt), tantalum (Ta), neodymium (Nd), scandium (Sc), or an alloy thereof.

A gate insulating layer GI is disposed on the gate electrode GE to insulate the semiconductor layer SCL and the gate electrode GE. The gate insulating layer GI may include at least one of a silicon oxide layer or a silicon nitride layer. For example, the gate insulating layer GI may have the silicon oxide layer and the silicon nitride layer in a stacked structure.

The semiconductor layer SCL may be disposed on the gate insulating layer GI, and may include an oxide semiconductor material. The oxide semiconductor material may include at least one of zinc (Zn), indium (In), gallium (Ga), tin (Sn), or a mixture thereof. For example, the semiconductor layer SCL may include an indium-gallium-zinc oxide (IGZO). Further, a region of the semiconductor layer SCL between connections with the source electrode SE and the drain electrode DE may be a channel region of the thin film transistor TFT.

The source electrode SE may be disposed on the semiconductor layer SCL. Further, the source electrode SE may protrude from the data line DL. The drain electrode DE may be spaced apart from the source electrode SE on the semiconductor layer SCL.

The source electrode SE and the drain electrode DE may include a barrier layer CBL, a main wiring layer MSL disposed on the barrier layer CBL, and a capping layer CCL disposed on the main wiring layer MSL.

First, the main wiring layer MSL may include a low resistance material, such as copper or a copper alloy.

The barrier layer CBL may include a first metal layer CLB1 and a second metal layer CBL2 disposed on the first metal layer CBL1.

The first metal layer CBL1 reacts with the semiconductor layer SCL so that no metal oxide material is formed, and may include a material suitable for dry etching. For example, the first metal layer CBL1 may include at least one of molybdenum (Mo), a molybdenum alloy (Mo alloy), aluminum (Al), an aluminum alloy (Al alloy), germanium (Ge), or niobium (Nb).

The second metal layer CBL2 may include a material suitable for dry etching which can prevent copper used in the main wiring layer MSL from diffusing. For example, the second metal layer CBL2 may include at least one of titanium (Ti), a titanium alloy (Ti-alloy), molybdenum (Mo), a molybdenum alloy (Mo alloy), aluminum (Al), an aluminum alloy (Al alloy), germanium (Ge), or niobium (Nb).

The capping layer CCL may include a transparent conductive oxide material. For example, the capping layer CCL may include one of an indium-zinc oxide (IZO), a gallium-zinc oxide (GZO), or an aluminum-zinc oxide (AZO). Here, a content of zinc oxide (ZnO) in the transparent conductive oxide may be 70 wt % or more.

A passivation layer PL may be disposed on the thin film transistor TFT. The passivation layer PL may include at least one layer. For example, the passivation layer PL may include an inorganic passivation layer PL1, and an organic passivation layer PL2 disposed on the inorganic passivation layer PL1. The inorganic passivation layer PL1 may include at least one of a silicon oxide layer or a silicon nitride layer. Further, the organic passivation layer PL2 may include at least one of acryl, polyimide (PI), polyamide (PA), or benzocyclobutene (BCB). That is, the organic passivation layer PL2 may be a transparent and flexible planarizing layer to smooth and planarize any irregularities in a lower structure.

Further, the passivation layer PL may include a contact hole CH through which a part of the drain electrode DE is exposed.

The display device DD connected to the drain electrode DE through the contract hole CH may be disposed on the passivation layer PL.

The display device DD may include a first electrode PE, a second electrode CE opposite to the first electrode PE, and an optical layer LC disposed between the first electrode PE and the second electrode CE to generate or allow light to pass therethrough.

Further, the display device DD may be any one of a liquid crystal display device (LCD device), an electrophoretic display device (EPD device), an electrowetting display device (EWD device), or an organic light emitting display device (OLED device). In a present exemplary embodiment, for convenience of the description, a liquid crystal display device is described as an example of a display device. Accordingly, the optical layer may be a liquid crystal layer. Further, the display device DD of the present invention may display an image using light provided from a backlight unit.

The first electrode PE may be disposed on the passivation layer PL, and may be connected to the drain electrode DE through the contact hole CH. Further, the first electrode PE may include a transparent conductive oxide, such as indium tin oxide (ITO) or indium zinc oxide (IZO).

The optical layer includes a plurality of liquid crystal molecules. The liquid crystal molecules may be aligned in a specific direction by an electric field formed by the first electrode PE and the second electrode CE to adjust transmittance of light. Accordingly, the electric field controls the optical layer LC to allow light received from the backlight unit to pass therethrough do that the display device DD can display an image.

The second electrode CE may include a transparent conductive oxide, such as indium tin oxide (ITO) or indium zinc oxide (IZO). Further, the second electrode CE receives a common voltage Vcom from an external source.

In addition, the second electrode CE may be disposed on one surface of the opposite substrate OS facing the base substrate BS.

The opposite substrate OS may include a color filter for imparting a predetermined color to light received from the backlight unit, in addition to the second electrode CE. Here, the color filter may be one of a red filter, a green filter, a blue filter, and a white filter, and may be formed by a process such as deposition or coating.

In the thin film transistor substrate, the source electrode SE and the drain electrode DE include a first metal layer CBL1 that includes a material that does not form an oxide when reacting with the semiconductor layer SCL, which may prevent the semiconductor layer SCL from being damaged. Accordingly, it is possible to improve a reliability of the thin film transistor TFT.

FIGS. 4 to 9 are process cross-sectional views that illustrate a method of fabricating the display device illustrated in FIGS. 1 to 3.

Figure 4:
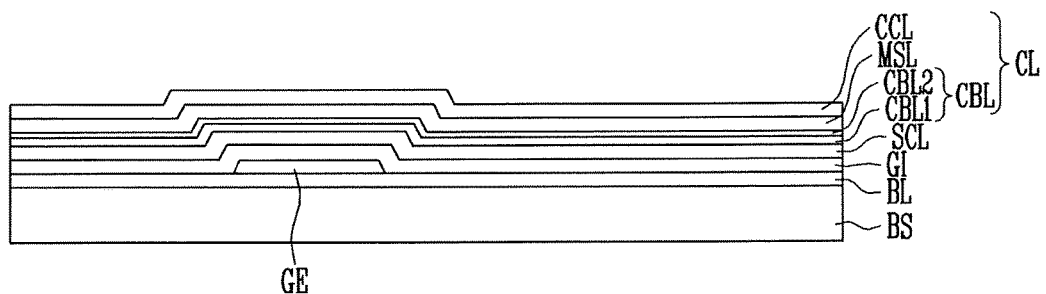
FIGS. 4 to 9 are process cross-sectional views that illustrate a method of fabricating the display device illustrated in FIGS. 1 to 3.

Referring to FIG. 4, an insulating layer BL is formed on the base substrate BS.

The base substrate BS includes a transparent insulating material to allow light to pass through. Further, the base substrate BS may be rigid or flexible. A rigid substrate may include a glass substrate, a quartz substrate, a glass ceramic substrate, or a crystalline glass substrate. A flexible substrate may include a film substrate including a polymer organic material or a plastic substrate. The material included in the base substrate BS may be resistant to a high processing temperature in a fabricating process.

The insulating layer BL may include at least one of a silicon oxide layer or a silicon nitride layer. The insulating layer BL can prevent impurities from diffusing into the thin film transistor TFT, and can prevent moisture and oxygen from permeating. Further, the insulating layer BL may planarize a surface of the base substrate BS.

After the insulating layer BL is formed, a gate line GL and a gate electrode GE are formed on the insulating layer BL. The gate electrode GE may protrude from the gate line GL. Further, the gate electrode GE and the gate line GL may include at least one of aluminum AL, an aluminum alloy (Al-alloy), silver (Ag), tungsten (W), copper (Cu), nickel (Ni), chrome (Cr), molybdenum (Mo), titanium (Ti), platinum (Pt), tantalum (Ta), neodymium (Nd), scandium (Sc), or an alloy thereof.

After the gate line GL and the gate electrode GE are formed, a gate insulating layer GI that covers the gate electrode GE is formed. The gate insulating layer GI may include at least one of a silicon oxide layer or a silicon nitride layer. For example, the gate insulating layer GI may include a silicon oxide layer and a silicon nitride layer in a stacked structure.

After the gate insulating layer GI is formed, a semiconductor layer SCL is formed on the gate insulating layer GI. The semiconductor layer SCL may include an oxide semiconductor material. The oxide semiconductor material may include at least one of zinc (Zn), indium (In), gallium (Ga), tin (Sn), or a mixture thereof. For example, the semiconductor layer SCL may include indium-gallium-zinc oxide (IGZO).

After the semiconductor layer SCL is formed, a conductive layer CL is formed on the semiconductor layer SCL. The conductive layer CL may include a barrier layer CBL disposed on the semiconductor layer SCL, a main wiring layer MSL disposed on the barrier layer CBL, and a capping layer CCL disposed on the main wiring layer MSL.

Hereinafter, a method of forming the conductive layer CL will be described in more detail.

First, the barrier layer CBL is formed on the semiconductor layer SCL. The barrier layer CBL may be formed by depositing the first metal layer CLB1 on the semiconductor layer SCL, and depositing the second metal layer CBL2 on the first metal layer CBL1.

The first metal layer CBL1 does not form a metal oxide when reacting with the semiconductor SCL when being deposited, and may include a material suitable for dry etching. For example, the first metal layer CBL1 may include at least one of titanium (Ti), a titanium alloy (Ti-alloy), molybdenum (Mo), a molybdenum alloy (Mo alloy), aluminum (Al), an aluminum alloy (Al alloy), germanium (Ge), or niobium (Nb).

When the first metal layer CBL1 reacts with the semiconductor layer SCL while being deposited, a metal oxide may be formed. When a metal oxide is formed, indium (In) may be educed from the semiconductor layer SCL. When indium (In) is educed from the semiconductor layer SCL, the semiconductor layer SCL may be damaged, which may degrade the reliability of a thin film transistor that includes a semiconductor layer SCL. Accordingly, the first metal layer CBL1 includes a material that does not form a metal oxide when reacting with the semiconductor SCL when being deposited, thereby improving reliability of the thin film transistor.

The second metal layer CBL2 may include a material suitable for dry etching and capable of preventing copper in the main wiring layer MSL from diffusing. For example, the second metal layer CBL2 may include at least one of titanium (Ti), a titanium alloy (Ti-alloy), molybdenum (Mo), a molybdenum alloy (Mo alloy), aluminum (Al), an aluminum alloy (Al alloy), germanium (Ge), or niobium (Nb).

After the barrier layer CBL is formed, the main wiring layer MSL is formed on the second metal layer CBL2. The main wiring layer MSL may include a low resistance material, such as copper or a copper alloy.

After the main wiring layer MSL is formed, a capping layer CCL is formed on the main wiring layer MSL. The capping layer CCL may include a transparent conductive oxide. For example, the capping layer CCL may include one of indium-zinc oxide (IZO), gallium-zinc oxide (GZO), or aluminum-zinc oxide (AZO). Here, a content of zinc oxide (ZnO) in the transparent conductive oxide may be 70 wt % or more. Zinc oxide (ZnO) is generally an amorphous material, which can prevent copper in the main wiring layer MSL from permeating or diffusing into a grain boundary. In particular, the capping layer CCL may prevent the formation of a copper oxide (CuOx), which is formed by direct contact with the inorganic passivation layer and the main wiring layer MSL when an inorganic passivation layer formed of silicon oxide (SiOx) is deposited. Copper oxide (CuOx) may cause lifting of the inorganic passivation layer, and corrosion of the main wiring layer MSL when a contact hole is formed.

Figure 5:
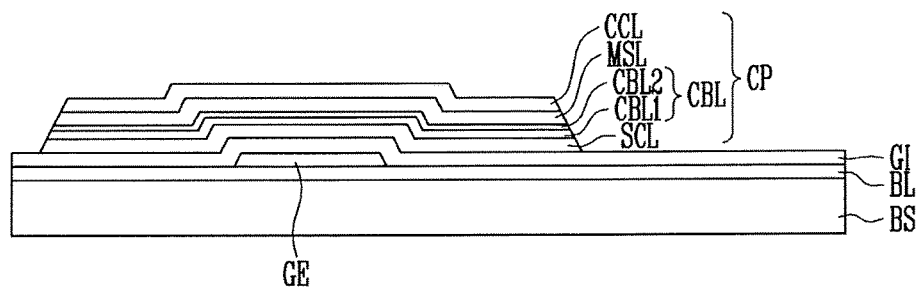

Referring to FIG. 5, after the conductive layer CL is formed, a first etching process is performed that collectively etches the semiconductor layer SCL and the conductive layer CL. The first etching process may be a wet etching process, and may form a conductive pattern CP that partially overlaps the gate electrode GE.

Figure 6:
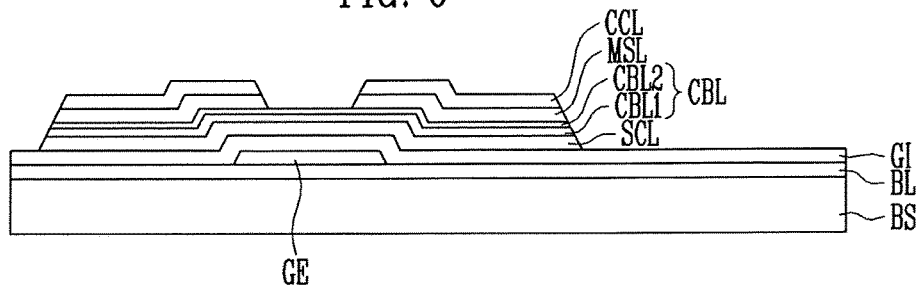

Referring to FIG. 6, after the first etching process, a second etching process is performed that partially etches the conductive patter CP. The second etching process may be a wet etching process, and may remove a region that overlaps the gate electrode GE of the main wiring layer MSL and the capping layer CCL. Accordingly, the barrier layer CBL overlapping the gate electrode GE may be exposed.

Figure 7:
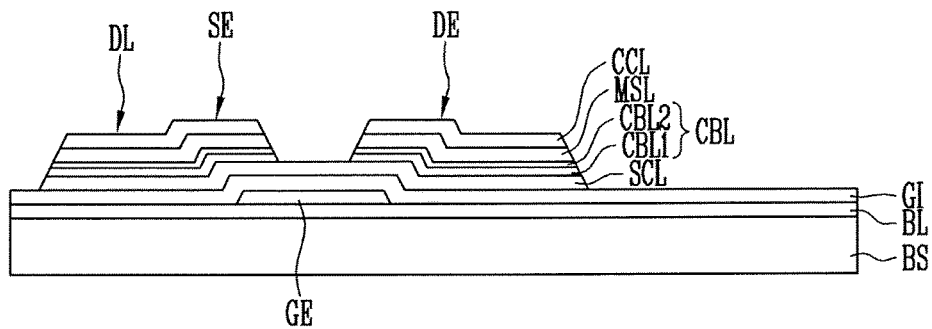

Referring to FIG. 7, after the second etching process, a third etching process is performed that etches the exposed region of the barrier layer CBL. The third etching process may be a dry etching process, and may remove a region of the barrier layer CBL that overlaps the gate electrode GE. Accordingly, a region of the semiconductor layer SCL that overlaps the gate electrode GE may be exposed. The exposed region of the semiconductor layer SCL may be a channel region of the thin film transistor TFT.

Further, the residual region of the conductive layer CL, that is, the conductive layer CL disposed on each side of the gate electrode GE may be a source electrode SE and a drain electrode DE of the tin film transistor, respectively. That is, a thin film transistor that includes a gate electrode GE, a semiconductor layer SCL, a source electrode SE, and a drain electrode DE may be completed by the third etching process.

Further, the third etching process is a dry etching process, so that the semiconductor layer SCL may not be damaged. That is, a dry etching process may prevent damage to the surface of the semiconductor layer SCL due to an etchant used during a wet etching process.

Figure 8:
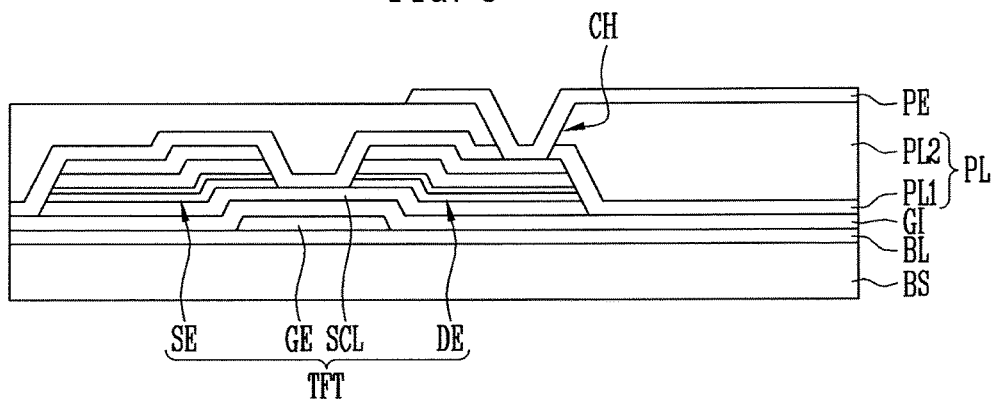

Referring to FIG. 8, a passivation layer PL is formed that covers the thin film transistor. The passivation layer PL may include an inorganic passivation layer PL1 and an organic passivation layer PL2 disposed on the inorganic passivation layer PL1.

In particular, the inorganic passivation layer PL1 is formed to cover the thin film transistor TFT. The inorganic passivation layer PL1 may include at least one of a silicon oxide layer or a silicon nitride layer.

After the inorganic passivation layer PL1 is formed, the inorganic passivation layer PL2 is formed on the inorganic passivation layer PL1. The organic passivation layer PL2 may include at least one of acryl, polyimide (PI), polyamide (PA), or benzocycloubutene (BCB). That is, the organic passivation layer PL2 may be a transparent and flexible planarizing layer that may smooth and planarize irregularities in a lower structure.

After the passivation layer PL is formed, a contact hole CH, through which a part of the drain electrode DE is exposed, is formed by patterning the passivation layer PL.

After the contact hole CH is formed, the first electrode PE, which connects to the drain electrode DE, is formed by depositing a transparent conductive material onto the passivation layer PL, and patterning the transparent conductive material. The first electrode PE may include a transparent conductive oxide, such as indium tin oxide (ITO) or indium zinc oxide (IZO).

Figure 9:
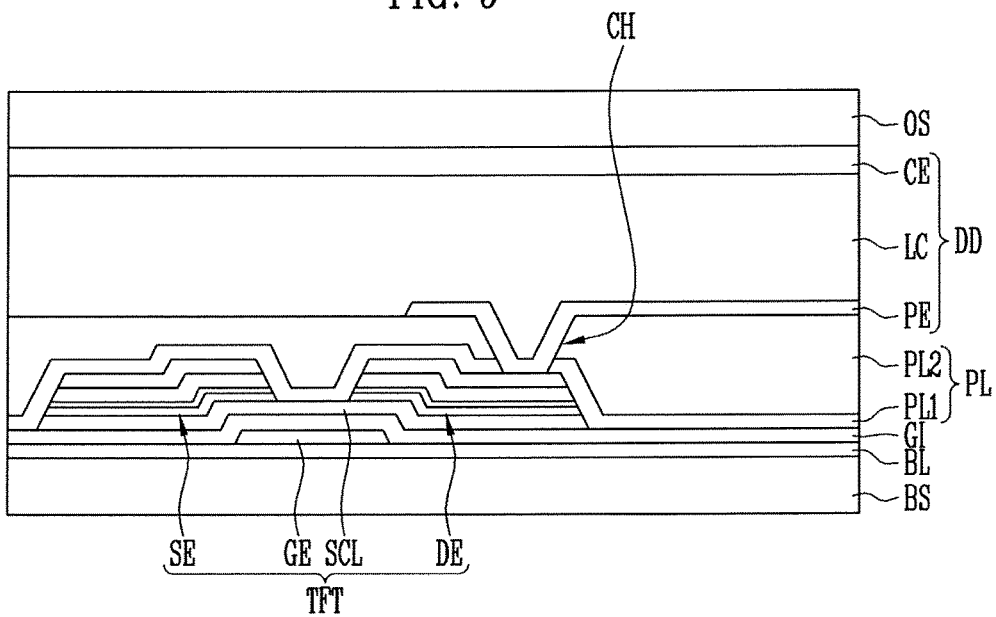

Referring to FIG. 9, after the first electrode PE is formed, an optical layer LC that includes a plurality of liquid crystal molecules is disposed on the first electrode PE.

After the optical layer LC is disposed, an opposite substrate OS is disposed on the optical layer LC. The opposite substrate OS includes a second electrode CE on a surface facing the first electrode PE. The second electrode CE may include a transparent conductive oxide, similar to the first electrode PE.

The first electrode PE, the optical layer LC, and the second electrode CE, which are sequentially disposed on the passivation layer PL, configure the display device DD.

By way of summation and review, a thin film transistor substrate according to an embodiment of the disclosure may prevent a semiconductor layer that includes an oxide semiconductor from being damaged, which may improve reliability of the thin film transistor.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present inventive concept as set forth in the following claims.

What is claimed is:

1. A method of fabricating a thin film transistor substrate, comprising:
   forming a gate electrode on a substrate;
   forming a semiconductor layer that partially overlaps the gate electrode, wherein the semiconductor layer includes an oxide semiconductor material;
   forming a conductive layer that includes a barrier layer and a main wiring layer on the semiconductor layer;
   forming a conductive pattern that partially overlaps the gate electrode by etching the semiconductor layer and the conductive layer in a first etching process;
   etching the main wiring layer in a second etching process wherein a region of the barrier layer that overlaps the gate electrode is exposed; and
   etching the exposed region of the barrier layer in a third etching process wherein a region of the semiconductor layer that overlaps the gate electrode is exposed,
   wherein the barrier layer includes a first metal layer disposed on the semiconductor layer and a second metal layer disposed on the first metal layer.

2. The method of claim 1, wherein the third etching process is a dry etching process.

3. The method of claim 1, wherein the first etching process and the second etching process are wet etching processes.

4. The method of claim 1, wherein the first metal layer includes at least one of molybdenum (Mo), a molybdenum alloy (Mo alloy), aluminum (Al), an aluminum alloy (Al alloy), germanium (Ge), or niobium (Nb).

5. The method of claim 1, wherein the second metal layer includes at least one of titanium (Ti), a titanium alloy (Ti-alloy), molybdenum (Mo), a molybdenum alloy (Mo alloy), aluminum (Al), an aluminum alloy (Al alloy), germanium (Ge), or niobium (Nb).

6. The method of claim 1, further comprising:
   forming a capping layer that includes a transparent conductive oxide on the main wiring layer before the first etching process.

7. The method of claim 6, wherein the capping layer includes one of indium-zinc oxide (IZO), gallium-zinc oxide (GZO), or aluminum-zinc oxide (AZO).

8. The method of claim 7, wherein a content of a zinc oxide (ZnO) in the transparent conductive oxide is 70 wt % or more.

9. A method of fabricating a thin film transistor substrate, comprising:
   forming a gate electrode on a substrate;
   forming a semiconductor layer that partially overlaps the gate electrode, wherein the semiconductor layer includes an oxide semiconductor material;
   forming a barrier layer by depositing a first metal layer on the semiconductor layer, and depositing a second metal layer on the first metal layer, wherein the first metal layer includes a material that does not form a metal oxide when reacting with the semiconductor when being deposited;
   forming a main wiring layer MSL on the second metal layer, wherein the main wiring layer includes a low resistance material; and
   forming a capping layer on the main wiring layer,
      wherein the second metal layer includes a material suitable for dry etching and capable of preventing copper in the main wiring layer from diffusing.

10. The method of claim 9, further comprising
    etching the semiconductor layer, the barrier layer and the main wiring layer in a first etching process to form a conductive pattern that partially overlaps the gate electrode, wherein the first etching process is a wet etching process;
    etching the main wiring layer in a second etching process wherein a region of the barrier layer that overlaps the gate electrode is exposed, wherein the second etching process is a wet etching process; and
    etching the exposed region of the barrier layer in a third etching process wherein a region of the semiconductor layer that overlaps the gate electrode is exposed, wherein the third etching process is a dry etching process.

11. The method of claim 9, wherein the first metal layer includes at least one of molybdenum (Mo), a molybdenum alloy (Mo alloy), aluminum (Al), an aluminum alloy (Al alloy), germanium (Ge), or niobium (Nb), and
    the second metal layer includes at least one of titanium (Ti), a titanium alloy (Ti-alloy), molybdenum (Mo), a molybdenum alloy (Mo alloy), aluminum (Al), an aluminum alloy (Al alloy), germanium (Ge), or niobium (Nb).

12. The method of claim 9, the capping layer includes a transparent conductive oxide that is one of indium-zinc oxide (IZO), gallium-zinc oxide (GZO), or aluminum-zinc oxide (AZO), and a content of a zinc oxide (ZnO) in the transparent conductive oxide is 70 wt % or more.

* * * * *